US010303545B1

(12) United States Patent
Meaney et al.

(10) Patent No.: US 10,303,545 B1
(45) Date of Patent: May 28, 2019

(54) HIGH EFFICIENCY REDUNDANT ARRAY OF INDEPENDENT MEMORY

(71) Applicant: INTERNATIONAL BUSINESS MACHINES CORPORATION, Armonk, NY (US)

(72) Inventors: Patrick J. Meaney, Poughkeepsie, NY (US); Christian Jacobi, West Park, NY (US); Barry M. Trager, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/827,285

(22) Filed: Nov. 30, 2017

(51) Int. Cl.
*G06F 11/10* (2006.01)
*H03M 13/09* (2006.01)
*H03M 13/15* (2006.01)
*G11C 29/52* (2006.01)

(52) U.S. Cl.
CPC .......... *G06F 11/1068* (2013.01); *G11C 29/52* (2013.01); *H03M 13/09* (2013.01); *H03M 13/1515* (2013.01)

(58) Field of Classification Search
CPC .... G06F 11/1068; G11C 29/52; H03M 13/09; H03M 13/1515
See application file for complete search history.

(56) References Cited

U.S. PATENT DOCUMENTS

| 7,320,086 | B2 | 1/2008 | Majni et al. |
| 8,041,989 | B2 | 10/2011 | Lastras-Montano et al. |
| 8,041,990 | B2 | 10/2011 | O'Connor et al. |
| 8,271,932 | B2 | 9/2012 | Bair et al. |
| 8,522,122 | B2 | 8/2013 | Alves et al. |
| 8,549,378 | B2 | 10/2013 | Alves et al. |
| 8,775,858 | B2 | 7/2014 | Gower et al. |
| 8,898,511 | B2 | 11/2014 | Gower et al. |
| 2004/0168101 | A1 | 8/2004 | Kubo |
| 2010/0017650 | A1 | 1/2010 | Chin et al. |
| 2013/0191698 | A1* | 7/2013 | Meaney .............. G06F 11/1004 714/758 |
| 2013/0191703 | A1* | 7/2013 | Meaney .............. G06F 11/1004 714/770 |

(Continued)

OTHER PUBLICATIONS

R. Motwani and C. Ong, "Soft decision decoding of RAID stripe for higher endurance of flash memory based solid state drives," 2015 International Conference on Computing, Networking and Communications (ICNC), Garden Grove, CA, 2015, pp. 603-607.*

(Continued)

*Primary Examiner* — Cynthia Britt
(74) *Attorney, Agent, or Firm* — William A. Kinnaman, Jr., Esq.; Hye Jin Lucy Song, Esq.; Helsin Rothenberg Farley & Mesiti P.C.

(57) ABSTRACT

A memory system includes memory modules having a number of sets of memory devices including data memory devices for data and error correction code (ECC). The ECC memory devices carry ECC symbols in order to facilitate Redundant Array of Independent Memory (RAIM) functionalities for the memory modules. A host receives and decodes the ECC symbols and executes RAIM operations. The host and the memory modules are coupled by a number of channels, one channel per each set of the memory devices.

20 Claims, 8 Drawing Sheets

(56) References Cited

U.S. PATENT DOCUMENTS

| 2014/0164881 A1* | 6/2014 | Chen | G11C 16/00 |
| | | | 714/773 |
| 2018/0129450 A1* | 5/2018 | Pax | G06F 12/0246 |
| 2018/0203627 A1* | 7/2018 | Gilda | G06F 3/0625 |

OTHER PUBLICATIONS

N. Zheng and Q. Li, "Joint decoding of RAID-ECC solutions for SSDs," 2017 55th Annual Allerton Conference on Communication, Control, and Computing (Allerton), Monticello, IL, 2017, pp. 429-436.*

J. Kim, J. Lee, J. Choi, D. Lee and S. H. Noh, "Improving SSD reliability with RAID via Elastic Striping and Anywhere Parity," 2013 43rd Annual IEEE/IFIP International Conference on Dependable Systems and Networks (DSN), Budapest, 2013, pp. 1-12.*

Meaney, P.J., et al., "IBM zEnterprise redundant array of independent memory subsystem", IBM J. Res. & Dev., vol. 56 No. 1/2, Paper 4, Jan./Mar. 2012, pp. 4:1-4:11.

* cited by examiner

HIGH EFFICIENCY REDUNDANT ARRAY OF INDEPENDENT MEMORY

TECHNICAL FIELD

One or more aspects of the present disclosure relate to computer memory technology, and more particularly, to maximizing efficiency in providing a highly reliable memory system.

BACKGROUND

The current Redundant Array of Independent/Inexpensive Memory (RAIM) design avoids memory operation failures by providing random access memory modules enhanced by a striping algorithm. While the RAIM design provides fault-tolerance and high availability functionalities, as a tradeoff, extra resources, in order to realize the high performance and reliability, are required. Memory failures are inherent due to various reasons, including a very high integration density, or based on operating environment conditions, such as high altitudes, and/or astronomical background radiations, etc. Conventional RAIM memory designs for fault-tolerant/error correcting functionalities in mainframe computer systems may include error correction code (ECC), chipkill, etc. Extra resources to provide the high reliability functionalities in conventional RAIM memory designs require additional overheads to support the high reliability functionalities.

BRIEF SUMMARY

Shortcomings of the prior art are overcome and additional advantages are provided through the provision of a high efficiency Redundant Array of Independent/Inexpensive Memory (RAIM) memory system. The memory system includes, for instance: a plurality of memory modules, where each memory module of the plurality of memory modules has a predefined number of sets of memory devices including one or more data memory devices for data and one or more error correction code (ECC) memory devices for ECC, where the ECC memory devices carry a predetermined number of ECC symbols in order to facilitate redundant array of independent memory (RAIM) functionalities for the plurality of memory modules; a host that is a memory controller executing RAIM operations, based on the ECC symbols from the memory modules; and a predefined number of channels coupling the host and the plurality of memory modules, where each channel of the predefined number of channels corresponds to a set of the predefined number of sets, where the predefined number of sets communicate with the host via respectively corresponding channels of the predefined number of channels.

Additional features and advantages of reducing the number of the ECC memory devices for the RAIM functionalities are realized through the aforementioned memory system, a number of the data memory devices (d) and a number of the ECC memory devices (e) in a set of the sets in the memory system may be respectively determined by the RAIM functionalities to support, where the predetermined number of the ECC symbols (r) is determined from the sum of ECC memory devices (e) in all the predefined number of the channels (A), that is, $r=\Sigma e$ (for all A), and where the predefined number of the ECC symbols (r) is greater than a sum of the number of the data memory devices (d) and the number of the ECC memory devices (e), that is, $r>(d+e)$, in order to support the RAIM functionalities.

Additional features and advantages of reducing the number of the ECC memory devices for the RAIM functionalities are realized through the aforementioned memory system, where the memory devices may have a predefined bitwise data width, where a number of the memory modules is equal to the predefined number of channels, and where each of the memory modules corresponds to a set from the predefined number of sets.

Additional features and advantages of reducing the number of the ECC memory devices for the RAIM functionalities are realized through the aforementioned memory system, where the memory devices may have a predefined bitwise data width, where a number of the memory modules is equal to a half of the predefined number of channels, and where each of the memory modules corresponds to two (2) sets from the predefined number of sets.

Additional features and advantages of reducing the number of the ECC memory devices for the RAIM functionalities are realized through the aforementioned memory system, where the memory devices may have a predefined bitwise data width, where a number of the memory modules is equal to a quarter of the predefined number of channels, and where each of the memory modules corresponds to four (4) sets from the predefined number of sets.

Another memory system includes, for instance: a plurality of memory modules, where each memory module of the plurality of memory modules has a predefined number of sets of memory devices including one or more data memory devices for data, one or more error correction code (ECC) memory devices for ECC, and one or more buffer, where the ECC memory devices carry a number of ECC symbols in order to facilitate redundant array of independent memory (RAIM) functionalities for the plurality of memory modules; a host that is a memory controller executing RAIM operations, based on the ECC symbols from the memory modules; and a predefined number of channels coupling the host and the plurality of memory modules for memory operations, where the predefined number of channels is equal to the predefined number of the sets of the memory devices, and where each of the memory module has the same number of set of the memory devices as the rest of the memory modules.

A method for controlling the memory system includes, for instance: obtaining, by a host, a predetermined number of Error Correction Code (ECC) symbols from each memory operation in a predefined number of homogeneous memory modules; decoding the ECC symbols for supported Redundant Array of Independent Memory (RAIM) functionalities; and executing RAIM operation as specified in an ECC scheme of the memory system, where at least one of the RAIM functionalities is selected from the group consisting of: memory error detection, memory error correction, chip marking, channel marking, chipkill, per-rank channel marking, graduated chip marking, hierarchical channel marking, static and dynamic lane sparing, channel cyclic redundancy check (CRC) checking, channel recovery, dynamic channel marking, power save marking, fourth generation double data rate memory (DDR4) support, fifth generation double data rate memory (DDR5) support, system scrub, initialization, self-test, and OpenCAPI (Coherent Accelerator Processor Interface) memory channel interface.

Methods and computer program products relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
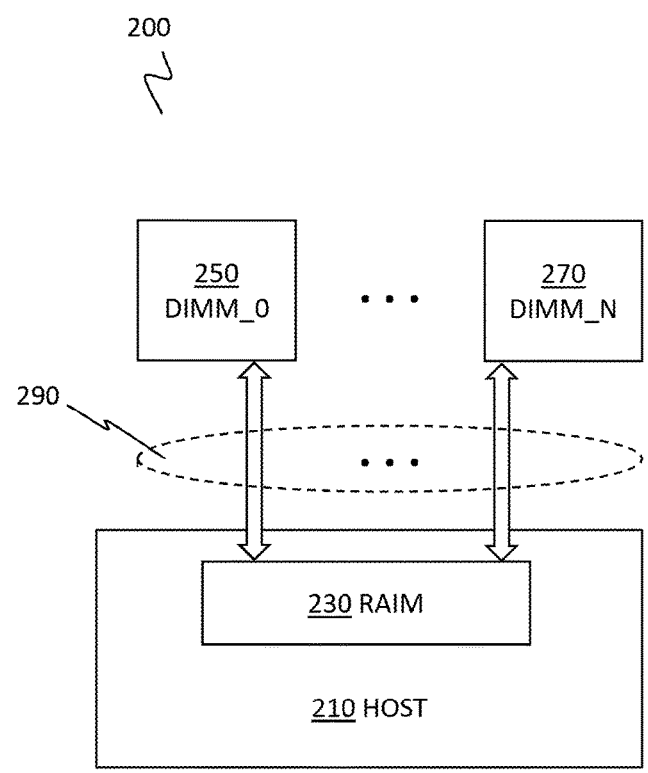
FIG. 1 depicts one example of a Redundant Array of Independent/Inexpensive Memory (RAIM) memory system, in accordance with one or more embodiments set forth herein.

The accompanying figures, in which like reference numerals may refer to identical or functionally similar elements throughout the separate views and which are incorporated in and form a part of the specification, further illustrate the present invention and, together with the detailed description of the invention, serve to explain the principles of the present invention. As understood by one of skill in the art, the accompanying figures are provided for ease of understanding and illustrate aspects of certain embodiments of the present invention. The invention is not limited to the embodiments depicted in the figures.

FIG. 1 depicts one example of a Redundant Array of Independent/Inexpensive Memory (RAIM) memory system 200, in accordance with one or more embodiments set forth herein.

In RAIM memory designs, a data word accompanies an error correction code (ECC) word, such that memory failures are identified and corrected, per channel and/or per DRAM chip. RAIM capacity, (e.g., the number of identifiable channels/DRAMs, the number of correctable errors, chipkills, etc.) is determined by the size of the ECC word, or by the ratio of data bits to ECC bits. The ratio of data bits to ECC bits in a RAIM memory design is referred to as the utilization and/or the efficiency of the respective RAIM memory design. Utilization of both ECC words and actual data words provide fail-safe functionality within the RAIM memory designs, however, the addition of the ECC words contributes to the computing resources (overhead) of the system. Overhead related to the ECC words includes both power consumption and cost, as measured in the number of ECC DRAM chips. The RAIM memory design of the RAIM memory system 200 significantly reduces the overhead when compared to existing RAIM memory designs.

Existing RAIM designs have a substantial overhead related to the number of DRAM chips utilized for RAIM functionality. As a result, these designs use a lot more power than primitive memory systems. A few examples of the RAIM functionalities may include, but are not limited to, memory error detection, memory error correction, chip marking, channel marking, and chipkill. One example of a RAIM design with significant overhead is an existing 5-channel, 5-Dual-Inline Memory Module (DIMM) design, which utilizes Error Correction Code (ECC) DRAM chips in each of four (4) memory modules that service data, and an additional ECC memory module, only for RAIM purposes. The conventional 5-channel, 5-DIMM design has an overall memory DRAM overhead of over 40%, because it uses 13 additional ECC DRAMs for every 32 data DRAMs (the 4 DIMMs each have 8 data DRAMs and 1 ECC DRAM, and the ECC DIMM has 9 DRAM chips). In the same existing design, when a spare DRAM is used for each of 5 DIMMs, the overall memory DRAM overhead is over 56% (based on using 18 additional ECC DRAMs for every 32 data DRAMs, in which each of 4 DIMMs have 8 data DRAMs and 2 ECC DRAMs, and the ECC DIMM has 10 DRAM chips). Thus, providing a RAIM design with the same functionality as this existing system with fewer DRAM chips would significantly reduce the cost and power consumption of a RAIM memory system. The RAIM memory system 200 described herein has significantly less memory overhead than the described existing RAIM designs.

In embodiments of the present invention, each channel is configured for each unit of a plurality of DRAM chips for data and ECC, instead of allocating one channel for each DIMM, as is the practice in existing RAIM systems. In embodiments of the present invention, each data and ECC unit has its own buffer, instead of a DIMM buffer. Embodiments of the present invention, as opposed to existing RAIM designs, do not require a dedicated DIMM for ECC because, as will be discussed in greater detail herein, the RAIM memory system 200 in embodiments of the present invention generates enough ECC symbols to support the aforementioned RAIM functionalities by increasing a number of channels or a number of ECC chips in respective units of (data+ECC) DRAM chips per channel, instead of the dedicated DIMM for ECC.

The terms "memory channel" and "channel" are used herein interchangeably to indicate each memory interface communicating commands, addresses, and/or data.

When compared to existing systems, the RAIM memory system 200 of some embodiments of the present invention offers a significant improvement in memory hardware cost: 1) by using fewer DRAM chips and fewer DIMMs; 2) by using less power; 3) by using fewer memory refreshes; and 4) by using less memory bandwidth per power consumption than aforementioned existing RAIM memory designs. Despite these design changes, RAIM memory systems incorporating aspects of the present invention, including but not limited to RAIM memory system 200, provide Reliability, Availability, and Serviceability (RAS) functionality (i.e., robustness and fault-tolerant computing hardware attributes), which is beneficial for computing hardware for critical applications.

A RAIM memory system, including RAIM memory system 200, may be present in mainframe computer systems servicing various real-time systems and high-availability systems, including financial transaction data systems. Systems integrated into mainframes have the requirement of being robust, so that they can continue to service applications, even in the presence of a fault. RAS indicates the robustness and fault-tolerance attributes of computing hardware. The RAIM functionalities provided by the RAIM memory system 200 contribute to the RAS attribute of the computing hardware that is implemented with the RAIM memory system 200. Examples of legacy RAS functionalities provided by conventional RAIM memory systems may include, but are not limited to, graceful degradation for all channels, high percentage of channel detection, DRAM marking, channel marking, per-rank channel marking, graduated chip marking, hierarchical channel marking, lane sparing, a recovery sequence of system scrub, initialization, and self-test. The RAIM memory system 200 further supports additional RAS functionalities including, but not limited to, OpenCAPI (Coherent Accelerator Processor Interface) memory channel interface, static and dynamic lane sparing, channel cyclic redundancy check (CRC) checking, channel recovery and dynamic channel marking, power save marking, and is compatible with the fourth generation double data rate memory (DDR4) and/or the fifth generation double data rate memory (DDR5) specification by the Joint Electron Device Engineering Council (JEDEC).

Figure 8:
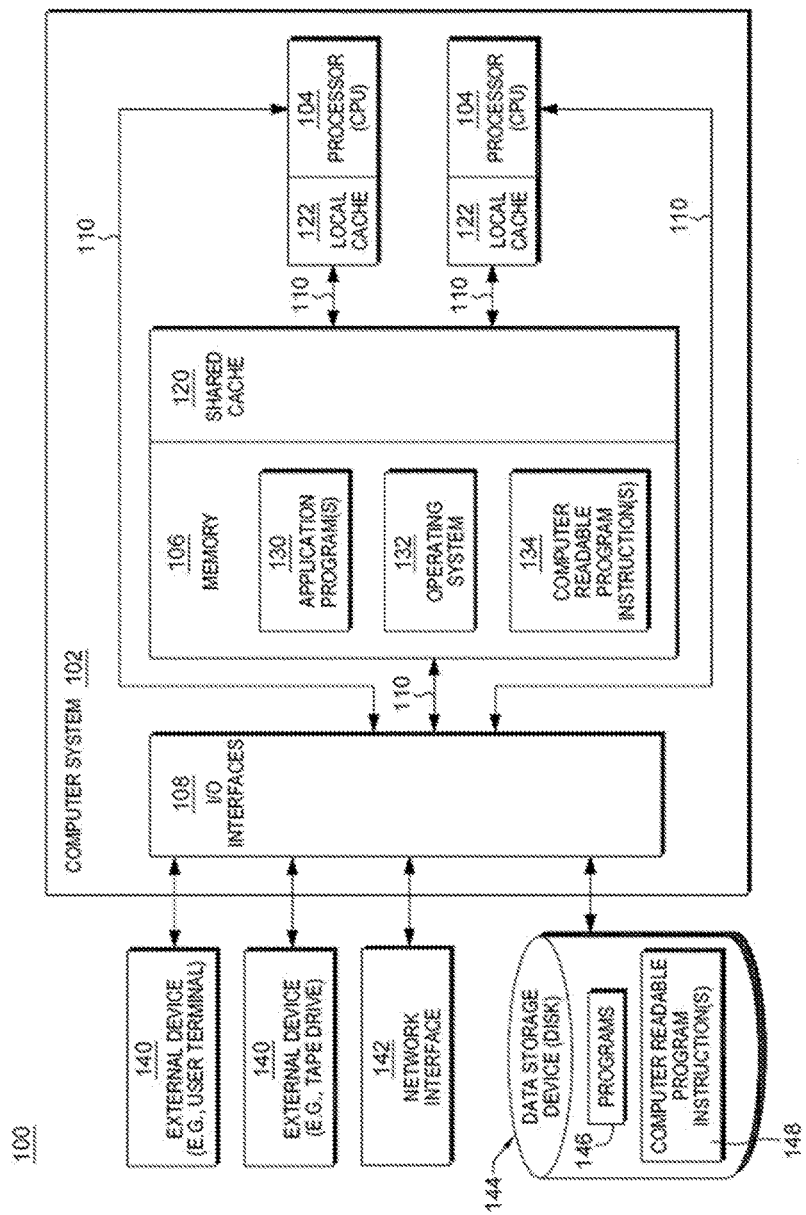
FIG. 8 depicts one example of a computing environment to incorporate and use one or more aspects of the present invention.

Returning to FIG. 1, some embodiments of the present invention include a RAIM memory system 200, which is a hardware component that implements a memory in a computing system. Referring to FIG. 8, the RAIM memory system 200 may be a hardware component implementing a memory 106 in the computer system 102 of FIG. 8. As illustrated in FIG. 1, aspects of some embodiments of the present invention include one or more DIMM 250, 270 and a host 210. FIG. 1, as a non-limiting example and for illustrative purposes only, includes two DIMMs 250 270. The host 210, which is a memory controller, includes a RAIM component 230. The RAIM 230 is coupled to the one or more DIMMs 250, 270 via a set of memory interfaces 290. In embodiments of the present invention, the RAIM memory system 200 distributes data across several independent memory modules, such as DIMMs, by using the RAIM 230 component in the host 210, which improves resource efficiency and reliability of memory systems by performing RAIM functionalities, such as memory error detection, memory error correction, and chip marking.

The host 210 is a memory controller of a computing environment and includes the RAIM component 230. The RAIM component 230 controls the one or more DIMMs; the one or more DIMMS operate as members of a memory array, as controlled by the RAIM component 230. The RAIM component 230 sends and receives data to and from the one or more DIMMs and controls the one or more DIMMs by sending commands and addresses.

The RAIM component 230 of the host 210 memory controller supports fault-tolerant functionalities for the one or more DIMMs 250, 270.

In embodiments of the present invention, the one or more DIMMs each include a number (e.g., N+1) of DIMMs, for example, DIMM_0 250, and DIMM_N 270. Each of the one or more DIMMs 250, 270 includes a plurality of Dynamic Random Access Memories (DRAMs) including data DRAMs and ECC DRAMs. Typically, DIMMs are implemented as a circuit board unit (card), and the DRAMs as memory chips on a DIMM card. Further, the set of memory interfaces 290 may be implemented as a slot (socket) on a host board, into which the DIMM card is inserted. DRAM chips on each DIMM may not be physically distinctive from each other, and accordingly, any DRAM chip within a DIMM may be configured to perform as a data DRAM or as an ECC DRAM. One example of an ECC technique used in the RAIM memory system 200 is utilizing Reed-Solomon codes. Also, each of the one or more DIMMs 250, 270 may further include one or more buffer chips relaying command/address/data signals from the memory interfaces 290 to the DRAM chips, on the respective DIMMs, and vice versa.

Figure 5:
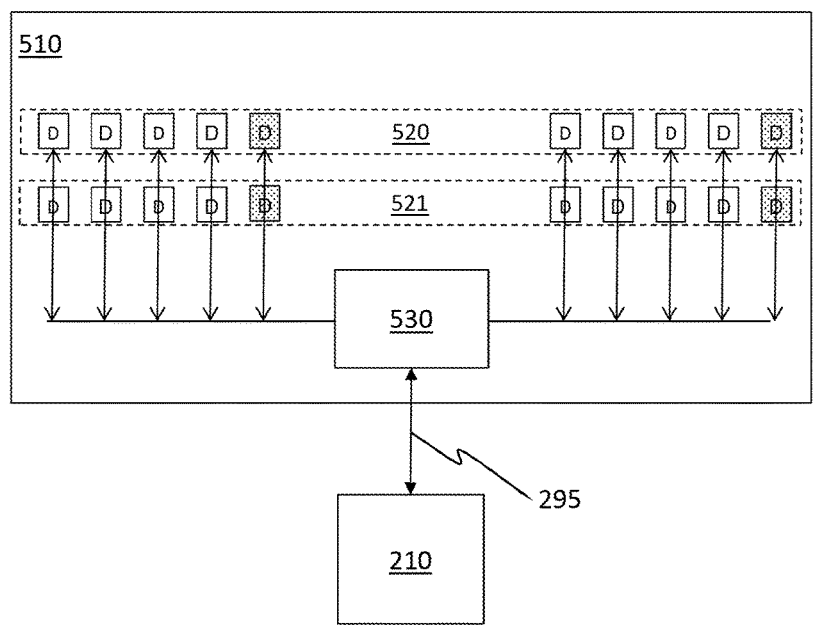
FIG. 5 depicts an example of a common buffer solution for the RAIM memory system, in accordance with one or more embodiments set forth herein.
Figure 6:
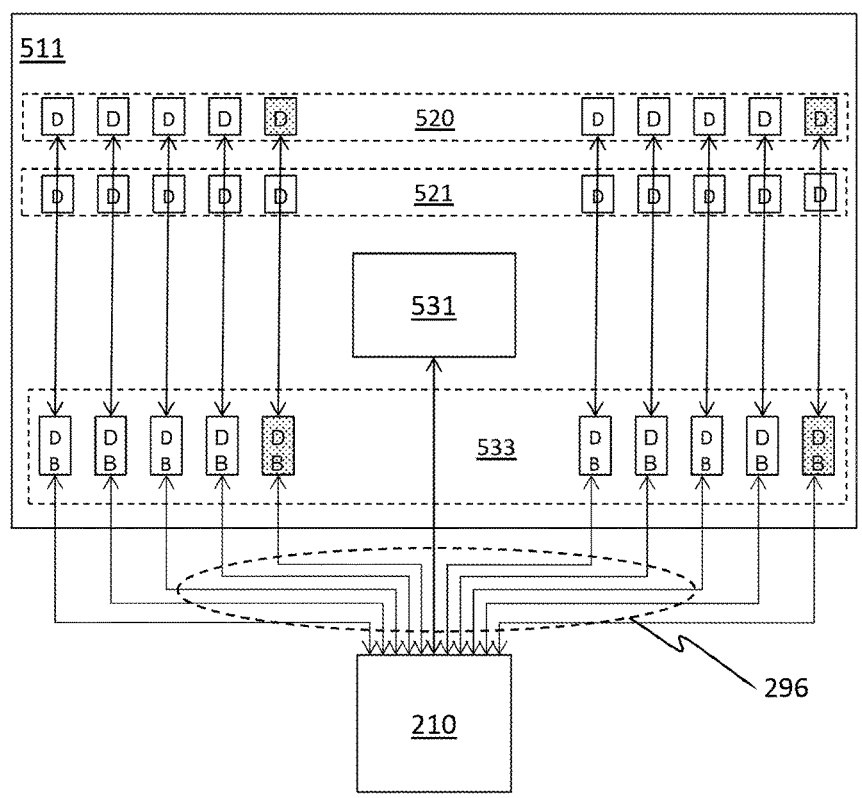
FIG. 6 depicts an example of a distributed buffer solution for the RAIM memory system, in accordance with one or more embodiments set forth herein.
Figure 7:
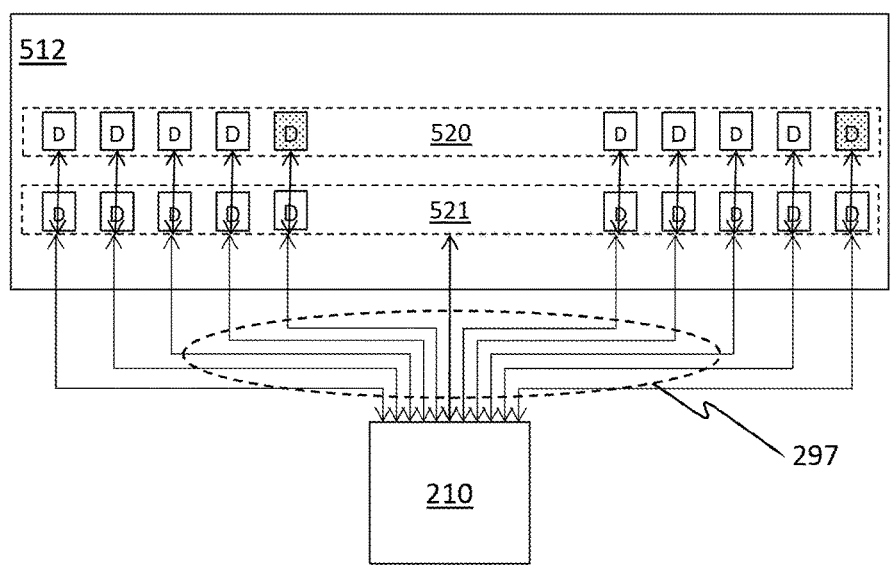
FIG. 7 depicts an example of a direct connection solution for the RAIM memory system, in accordance with one or more embodiments set forth herein.

The set of memory interfaces 290 indicates communication paths between the RAIM 230 and the one or more DIMMs 250, 270. In one example, the set of memory interfaces 290 has eight (8) memory channels coupled to either eight (8), four (4), or two (2) DIMMs, and the 8 memory channels are evenly distributed amongst the respective number of DIMMs, such as 1 channel per DIMM in an 8-DIMM embodiment, 2 channels per DIMM in a 4-DIMM embodiment, and 4 channels per DIMM in a 2-DIMM embodiment, as shown in embodiments of FIGS. 2, 3, and 4, respectively. The memory channels may further indicate internal communication paths within the DIMMs, as shown in the embodiments of FIGS. 5, 6, and 7.

Figure 2:
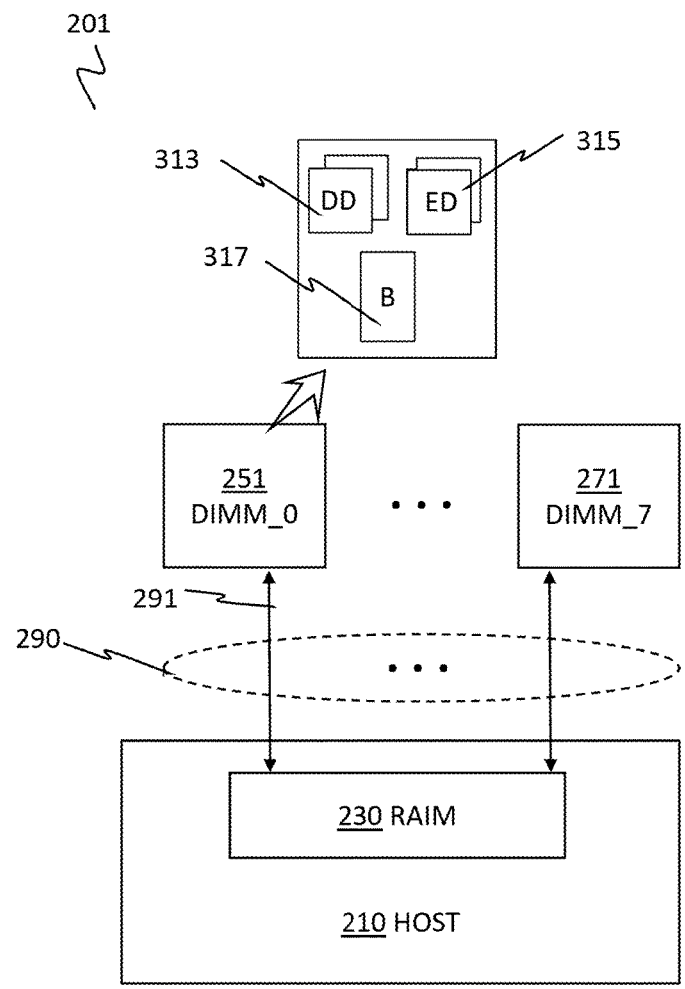
FIG. 2 depicts an example of an 8-channel, 8-DIMM embodiment of the RAIM memory system, in accordance with one or more embodiments set forth herein.
Figure 3:
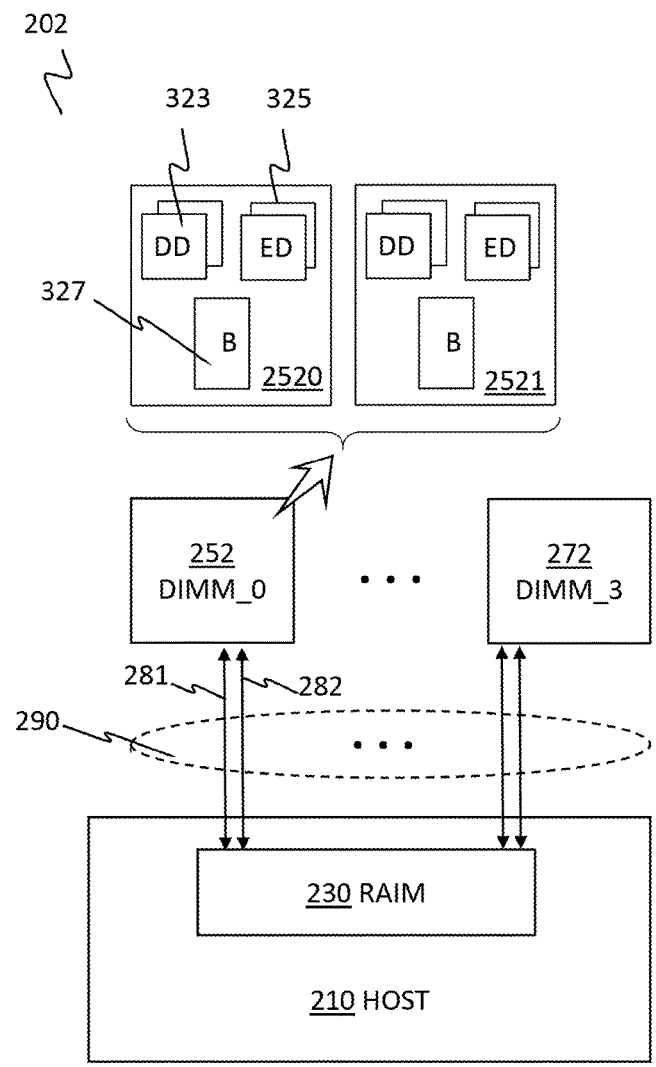
FIG. 3 depicts an example of an 8-channel, 4-DIMM embodiment of the RAIM memory system, in accordance with one or more embodiments set forth herein.
Figure 4:
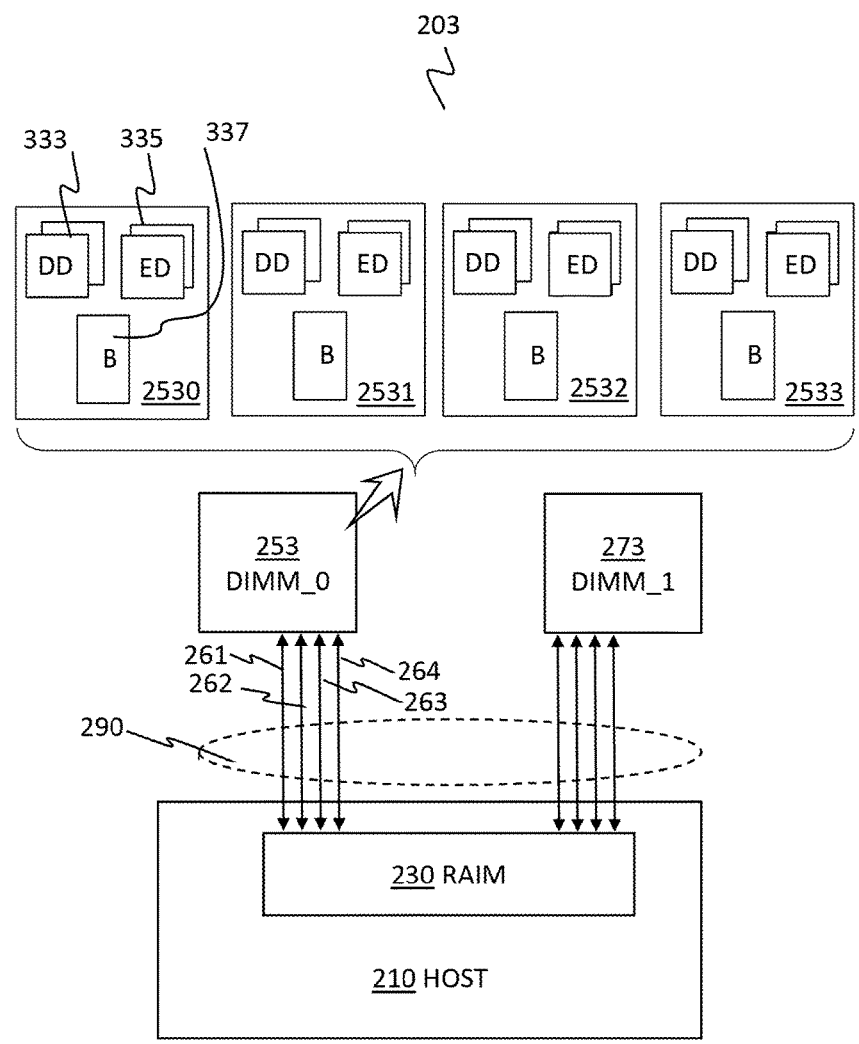
FIG. 4 depicts an example of an 8-channel, 2-DIMM embodiment of the RAIM memory system, in accordance with one or more embodiments set forth herein.

FIGS. 2, 3, and 4 depict respective embodiments 201, 202, and 203 of the RAIM memory system 200 of FIG. 1, in accordance with one or more embodiments set forth herein. As explained above, in embodiments of the present invention, each channel is configured for each unit of data and ECC DRAM chips, instead of allocating one channel for each DIMM, as is the practice in existing RAIM systems.

The embodiments 201, 202, and 203 respectively depict eight (8) channel organization 290 of the RAIM memory system 200 between the DIMMs and the host 210. Channels in the embodiments 201, 202, and 203 are respectively configured to support respective buffer configurations within the DIMMs. The embodiments 201, 202, and 203 include, for example, similar channels where the DIMMs utilize a common buffer solution for a combined command/address/data interface, as shown in FIG. 5.

The embodiments 201, 202, and 203 respectively have a preconfigured ratio of data DRAMs to ECC DRAMs per channel, indicating for every four (4) data DRAMs, one ECC DRAM is added. The preconfigured ratio is determined to most effectively provide ECC functions for every bit of data. In the embodiments 201, 202, and 203, the preconfigured ratio is four-to-one (4:1), when the ECC mechanism is implemented by using Reed-Solomon codes. The embodiments 201, 202, and 203, accordingly, support two-bit ECC for every one byte (8-bits) of data. The same organization may also be expressed in a five-to-one (5:1) ratio of the total number of DRAMs to the number of ECC DRAMs, as the total number of DRAMs is five (5), which includes four (4) data DRAMs and one (1) ECC DRAMs, that is (4+1). The total number of bits is referred to as the length, or the size, of an ECC word, including data bits and ECC bits, and is equal to the total number of DRAMs.

The embodiments 201, 202, and 203 respectively represent embodiments utilizing ×8 DRAMs, where a ×8 (pronounced "by eight") DRAM indicates the 8-bit data width of a DRAM chip on the DIMM. Each DRAM chip communicates 16 bits of data, by communicating from 8-bit data over two (2) beats at a double data rate (DDR). As noted above, because the DIMMs of the embodiments 201, 202, and 203 use one (1) ECC DRAM chip for every four (4) data DRAM chips, each channel in the embodiments 201, 202, and 203 is allocated to a unit of (4+1) DRAM chip configuration. A channel in ×8 DRAM chip organization is 80-bit-wide, providing a data path aggregated 64-bit data and 16-bit ECC, that is, 16*(4+1).

In order to improve memory density, or granularity, respective extensions of the embodiments 201, 202, and 203 may be implemented by utilizing ×4 DRAM chips, where ×4 (pronounced "by four") indicates the 4-bit data width of the DRAM chip, which may double the memory density by accessing data in 4-bit width instead of 8-bit width of ×8 DRAM chip. Doubling the memory density is accomplished by connecting two (2)×4 DRAM chips to each ×4 memory channel, supporting the same 8-bit data width as a ×8 DRAM coupled to one ×8 memory channel. The extra capacity of each of the ×4 chips are mapped into an additional address bit. The 4:1 ratio of data to ECC is also applicable for the extensions, and accordingly, a channel in ×4 DRAM chip organization is 80-bit-wide, providing a data path aggregated 64-bit data and 16-bit ECC. Accordingly, a ×4 configuration provides the same total data space (64-bit data plus 16-bit ECC) with ten (10) DRAM symbols, in comparison to five (5) DRAM symbols in a ×8 configuration. Additional DRAM symbols support more options for DRAM marking and channel marking than configurations with fewer DRAM symbols, as described below.

Further embodiments of the present invention utilize an eight (8) channel organization of the RAIM memory system 200 with a sixteen-to-three (16:3) ratio of data DRAM chips to ECC DRAM chips. These embodiments may also support RAIM functionalities such as memory error detection, memory error correction, chip marking, channel marking, and chipkill and offer a better utilization of resources than some of the other exemplary designs. This embodiment would have 128 data and 24 ECC symbols across the eight channels. While this 16:3 ratio (18.75%) is lower than the 4:1 or 8:2 ratio (25%) described herein, it utilizes a larger memory line size and more average power for smaller transfers, due to the larger line sizes, which can use more power. However, for larger bandwidths and larger memory transfer sizes, the larger line size provides more efficiency. Other embodiments with larger line sizes or more channels are also anticipated as applications of this invention to achieve efficient, high-reliable designs.

Further embodiments of the present invention utilize an eight (8) channel organization of the RAIM memory system 200 with a sixteen-to-three (16:3) ratio of data DRAM chips to ECC DRAM chips. These embodiments may also support RAIM functionalities such as memory error detection, memory error correction, chip marking, channel marking, and chipkill and offer a better utilization of resources than some of the other exemplary designs. This embodiment would have 128 data and 24 ECC symbols across the eight channels. While this 16:3 ratio (18.75%) is lower than the 4:1 or 8:2 ratio (25%) described herein, it utilizes a larger memory line size and more average power for smaller transfers, due to the larger line sizes, which can use more power. However, for larger bandwidths and larger memory transfer sizes, the larger line size provides more efficiency. Other embodiments with larger line sizes or more channels are also anticipated as applications of this invention to achieve efficient, high-reliable designs.

Further embodiments of the present invention utilize a four (4) channel organization of the RAIM memory system 200 with an eight-to-three (8:3) ratio of data DRAM chips to ECC DRAM chips. These embodiments may also support RAIM functionalities such as memory error detection, memory error correction, chip marking, channel marking, and chipkill and offer a better utilization of resources than the aforementioned conventional 5-channel, 5 DIMMs RAIM designs, in which, as discussed earlier, a spare DIMM is used for the sole purpose of ECC capabilities. As aforementioned, unlike in existing RAIM designs, embodiments of the present invention do not require a dedicated DIMM for ECC because the RAIM memory system 200 generates enough ECC symbols to support the aforementioned RAIM functionalities by increasing a number of channels or a number of ECC chips in respective units of (data+ECC) DRAM chips per channel, instead of utilizing a dedicated DIMM for ECC.

FIG. 2 depicts an example of an 8-channel, 8-DIMM embodiment 201 of the RAIM memory system 200 of FIG. 1, in accordance with one or more embodiments set forth herein.

The 8-channel, 8-DIMM embodiment 201 of the RAIM memory system 200 includes eight (8) DIMMs, from DIMM_0 251 through DIMM_N 271, where N=7. Each DIMM of DIMM_0 251 through DIMM_7 271, in one example, has the same components. DIMM_0 251 has a set of DRAM chips including data DRAMs (DD) 313 and ECC DRAMs (ED) 315, with a ratio of 4:1 data DRAMs to ECC DRAMs.

Unlike in existing RAIM designs, the 8-channel, 8-DIMM embodiment 201 of the present invention does not require a dedicated DIMM for ECC because the RAIM memory system 200 generates enough ECC symbols to support the aforementioned RAIM functionalities by increasing a number of channels, instead of utilizing a dedicated DIMM for ECC.

In one embodiment, each DIMM of DIMM_0 251 through DIMM_7 271 is a ×8 DIMM, and a set of five (5) DRAMs: four (4) data DRAMs and one (1) ECC DRAM, communicates via one channel 291. As illustrated in FIG. 2, where the DIMMs of DIMM_0 251 through DIMM_7 271 are ×4 DIMMs, a set of ten (10) DRAMs on each DIMM: eight (8) data DRAMs and two (2) ECC DRAMs, communicates via one channel 291.

As depicted in FIG. 2, DIMM_0 251 may further include zero or more buffer chips (B) 317, as determined by the buffer organization, shown in FIGS. 5, 6, and 7. The set of memory interfaces 290 includes eight (8) channels, one channel for each DIMM of DIMM_0 251 through DIMM_7 271, coupling the respective DIMMs to the RAIM 230. A channel 291 between DIMM_0 251 and the RAIM 230 is representative of the eight channels for each of 8 DIMMs. In an embodiment of the present invention, the buffers 317 are placed on a planar board (e.g., on the system board) and the board is used to couple the RAIM component 230 to the DIMM 251, which may be a direct DIMM 512 as shown in FIG. 7. In another embodiment of the present invention, the buffers 317 are placed on a riser card, which contains one or more direct DIMMs 512. Examples of the direct DIMMs 512 may include, but are not limited to, register DIMMs (RDIMMs), and load reduced DIMMs (LRDIMMS).

FIG. 3 depicts an example of an 8-channel, 4-DIMM embodiment 202 of the RAIM memory system 200 of FIG. 1, in accordance with one or more embodiments set forth herein.

The 8-channel, 4-DIMM embodiment 202 of the RAIM memory system 200 includes four (4) DIMMs, from DIMM_0 252 through DIMM_N 272, where N=3. In the same embodiment, each DIMM of four compatible DIMMs, DIMM_0 252 through DIMM_3 272, respectively has two sets of a preconfigured number of DRAM chips, communicating with the RAIM 230, via a channel per set. Accordingly, each DIMM of DIMM_0 252 through DIMM_3 272 is coupled to the RAIM 230 via the respective two channels. For example, DIMM_0 252 is coupled to the RAIM 230 via two channels 281, 282. A first unit 2520 of DIMM_0 252 has a set of ten (10)×4 DRAM chips including eight (8) data DRAMs (DD) 323 and two (2) ECC DRAMs (ED) 325, for a ratio of 4:1 between the numbers of data DRAMs (DD) 323 and ECC DRAMs (ED) 325, and zero or more buffer chips (B) 327, according to the buffer organization. The first unit 2520 of DIMM_0 252 is coupled to the RAIM 230 via a first channel 281. Similarly, in the same embodiment, a second unit 2521 of DIMM_0 252 has the same respective numbers of DD, ED, and an optional B as the first unit 2520, and is coupled to the RAIM 230 via a second channel 282. As noted, the 8-channel memory interfaces 290 are distributed as two channels per DIMM of DIMM_0 252 through DIMM_3 272, one channel for a half of each DIMM.

In another embodiment, the DIMMs are ×8 DIMMs, and each DIMM of DIMM_0 252 through DIMM_3 272 has two sets of five (5, or 4 data+1 ECC) DRAM chips communicating with the RAIM 230, via a channel per set. Similar to the ×4 DIMM example above, a first half 2520 of DIMM_0 252 communicates with the RAIM 230 via the first channel 281 of the two channels 281, 282 coupling DIMM_0 252 and the RAIM 230, and the second half 2521 of DIMM_0 252 communicates with the RAIM 230 via the second channel 282. Two channels 281, 282 between DIMM_0 252 and the RAIM 230 are representative of two channels for each of 4 DIMMs.

FIG. 4 depicts an example of an 8-channel, 2-DIMM embodiment 203 of the RAIM memory system 200 of FIG. 1, in accordance with one or more embodiments set forth herein.

The 8-channel, 2-DIMM embodiment 203 of the RAIM memory system 200 includes, for instance, two (2) DIMMs, from DIMM_0 253 through DIMM_N 273, where N=1. In one embodiment, the DIMMs are ×4 DIMMs, both DIMM_0 253 and DIMM_1 273 have four (4) sets of ten (10, or 8+2) DRAM chips communicating with the RAIM 230, via a channel per set. Accordingly, each DIMM of DIMM_0 253 through DIMM_1 273 is coupled to the RAIM 230 via four channels, 261, 262, 263, 264, as shown in the 8-channel memory interfaces 290. A first unit 2530 of DIMM_0 253 has, for example, a set of ten (10)×4 DRAM chips including eight (8) data DRAMs (DD) 333 and two (2) ECC DRAMs (ED) 335, for a ratio of 4:1 between the number of data DRAMs and the number of ECC DRAMs, and zero or more buffer chips (B) 337, according to the buffer organization. The first unit 2530 of DIMM_0 253 communicates with the RAIM 230 via a first channel 261. A second unit 2531, a third unit 2532, and a fourth unit 2533 of DIMM_0 253 are respectively analogous, in one example, to the first unit 2530 of DIMM_0 253, including the respective numbers of DD, ED, and an optional B. Similar to the first unit 2530 of DIMM_0 253, the second unit 2531, the third unit 2532, and the fourth unit 2533 of DIMM_0 253 communicates with the RAIM 230 via channels 262, 263, 264, respectively. Four channels 261, 262, 263, 264 between DIMM_0 253 and the RAIM 230 are representative of another four channels between DIMM_0 273 and the RAIM 230.

In another embodiment, the DIMMs are ×8 DIMMs, and each DIMM of DIMM_0 253 and DIMM_1 273 has four (4) sets of five (5, or 4 data+1 ECC) DRAM chips communicating with the RAIM 230 via a channel per set.

Table 1 below presents that embodiments 201, 202, and 203, using ×4 DIMMs and ×8 DIMMs are respectively compatible with the RAIM 230, and accordingly, the embodiments 201, 202, and 203 may support RAIM functionalities such as memory error detection, memory error correction, chip marking, and channel marking. The "×4 DRAMs" column indicates embodiments of 201, 202, and 203 when using ×4 DIMMs. The "×8 DRAMs" column indicates embodiments of 201, 202, and 203 when using ×8 DIMMs.

TABLE 1

| Implementation options | ×4 DRAMs | ×8 DRAMs |
| --- | --- | --- |
| A = Number of RAIM channels | 8 | 8 |
| B = Symbol per channel (d + e) | 8 + 2 | 4 + 1 |
| C = Total number of symbols (d' + e') | 64 + 16 | 32 + 8 |
| r = ECC symbols (e') | 16 | 8 |
| p = DRAM detect/correct for unmarked symbol | 3 | 3 |
| s = Single channel marks (d + e) | 10 | 5 |
| t = DRAM marks | 3 | 0 |
| x = Extra symbols | 0 | 0 |

In order to support the RAIM functionalities of detecting and correcting memory errors in data symbols, the RAIM 230 in the host 210 memory controller marks channels and DRAMs in the RAIM memory system 200 with respective ECC symbols, where a total number of ECC symbols is notated as (e'), and a total number of data symbols is notated as (d'), in the row beginning with "C" of Table 1. The remaining rows in Table 1 are design options of how to use the r=e' symbol capabilities. Details of the design options are described below.

The first row of Table 1 indicates the number of RAIM channels (A) in respective implementations. As the embodiments 201, 202, and 203 respectively have eight (8) channels between the DIMMs and the RAIM, A=8 for both implementations.

The second row of Table 1 indicates the number of symbols per channel (B) in respective implementations, represented as a sum of the number of data symbols (d) and the number of ECC symbols (e). For ×4 DIMM implementations, B=(8+2), indicating that each channel has eight (8) data symbols (d=8) for each data DRAMs and two (2) ECC symbols (e=2) for each ECC DRAMs, in the ×4 DIMM implementations of the embodiments 201, 202, and 203. For ×8 DIMM implementations of the embodiments 201, 202, and 203, B=(4+1), indicating that each channel has four (4) data symbols (d=4) for each data DRAMs and one (1) ECC symbols (e=1) for an ECC DRAM.

The third row of Table 1 indicates a total number of symbols (C), aggregating the number of symbols per channel (B) for all eight (8) channels. Accordingly, respective values are A*B, per channel (B) in respective implementations, also represented in a format adding the total number of data symbols (d') and the total number of ECC symbols (e'). For ×4 DIMM implementations, A*B=8*(8+2)=(d'+e'=64+16), as the ×4 DIMM implementations of the embodiments 201, 202, and 203 have eight (8) channels each coupling eight (8) data DRAMs and two (2) ECC DRAMs per channel. For ×8 DIMM implementations, A*B=8*(4+1)=(d'+e'=32+8) as the ×8 DIMM implementations of the embodiments 201, 202, 203 have eight (8) channels each coupling four (4) data DRAMs and one (1) ECC DRAMs per channel.

The fourth row of Table 1 separates the total number of ECC symbols (r), which is equal to the second term (e') of C from the third row, respective to implementations of the columns. The value of r=e' represents the total number of symbols that can be used for marking and correction. Each of the following rows, five through eight, represent different uses for the r=e' number of symbols. While two combinations of these four columns are shown, comparing a ×4 implementation and a ×8 implementation, there may be other RAIM-capable combinations of p, s, t, and x.

The fifth row of Table 1 indicates the number of symbols used for a single, unmarked DRAM detection and correction, notated as (p). Reed-Solomon codes use three (3) symbols for correcting any single symbol error and detecting any 2 symbol errors outside the marked symbols, regardless of the size of the symbols. Accordingly, in ×4 embodiment in ×4 DRAM column, out of sixteen (16)×4 symbols, three (3) of the symbols are set aside for error correction, and thirteen (13)×4 symbols are left available for other RAIM functions including channel mark and DRAM mark. Similarly in ×8 embodiment in ×8 DRAM column, out of eight (8)×8 symbols, three (3) of the symbols are set aside for Reed-Solomon error correction, and five (5)×8 symbols are left available for other RAIM functions including channel mark and DRAM mark.

In an embodiment, three symbols, p=3, is reserved to allow for correction of a single symbol and detection for two symbols, beyond what is marked. Accordingly, in embodiments where the number of symbols used for error detection and error correction is less than two (p<2), some errors originating from a new, failing, unmarked DRAM may not be properly corrected. In similar embodiments where p<3 and two, unmarked DRAMs have errors, these errors may not be properly detected and may be miscorrected with no further indication of the error, which results in a corruption of data. In an embodiment where p<3 and two symbols have errors, an error may be presented as uncorrectable rather than allowing a miscorrection for these cases.

The sixth row of Table 1 represents the number of symbols used to mark a single channel, that is, d+e. A channel mark means a group of symbols, r, are used to guard against known bad channel errors by ignoring data from all the DRAMs in a channel that is known to be error-prone. In certain embodiments, all DRAMs in the channel are all DRAMS for a given rank, and consequently, marking a channel would be accomplished by marking a DRAM mark for each chip (d+e) within the channel. The DRAM marks for a single channel is noted as (s), which is equal to (d+e), in respective implementations. For ×4 DIMM implementations, s=(8+2)=10, as the ×4 DIMM implementations of the embodiments 201, 202, 203 have a total of ten (10) DRAMs to identify, as detailed in the second row (B). For ×8 DIMM implementations, s=(4+1)=5, as the ×8 DIMM implementations of the embodiments 201, 202, 203 have a total of five (4) DRAMs to identify.

The seventh row of Table 1 beginning with "t" represents the number of individual DRAM marks that may be invoked. The individual DRAM marks may be present in any channel and are in addition to any DRAMs associated with a channel mark. Each DRAM mark corresponds to one of the total number of DRAMs, (d'+e'), which is equal to (C) in the third row of Table 1. For instance, for ×4 DRAM configurations, out of the 64+16=80×4 DRAM chips, up to three (t=3) DRAMs may be marked. Errors from any one of three (3) marked DRAMs are ignored by the RAIM 230. The maximum DRAM marks allowed is denoted by (t). It is noteworthy that the ×8 configuration only has enough symbols (r=e') to provide for 100% DRAM detection/correction (p=3) and channel marking (s=5). There are no additional symbols available for DRAM marks on top of channel marks (x=0). However, in an embodiment of ×8 DRAMs, not shown in Table 1, the RAIM functionalities may be configured only for the maximum DRAM marking without channel marking, that is, (t=5, s=0). Individual DRAM marking is, as noted above, applicable to any single channel or to any five (5) DRAMs out of the total forty (40) DRAMs in the embodiment, that is, (C=d'+e'=40). For ×4 DIMM implementations, t=3, because there are 3 remaining symbols after accounting for p and s, (t=(r−p−s)=(16−3−10)=3) of the embodiments 201, 202, 203. For ×8 DIMM implementations, t=0 because there is no remaining symbols after accounting for d and s, (t=(r−p−s)=(8−3−5)=0) of the embodiments 201, 202, 203.

The eighth row of Table 1 represents the number of symbols (x) that are available after using p number of symbols for DRAM detection and correction for unmarked DRAMs, s number of symbols for single channel DRAM marks, and t number of symbols for individual DRAM marks, that is, x=(r−p−s−t). The x number of symbols may be used for additional RAIM functions. Examples of the additional RAIM function may include: to allow for multiple symbol correction with an enhanced Reed-Solomon code by increasing more symbol for error detection and error correction, that is, p>3; and data META bits to carry additional data and/or tags.

As noted, the embodiments 201, 202, and 203 may be implemented in 8 channels, each channel having 16 data DRAMs and 4 ECC DRAMs; that is (16+4); or 8 channels, each channel having 8 data DRAMs and 2 ECC DRAMs; that is (8+2). Either of these options can be implemented with 2, 4, or 8 DIMMs, each DIMM of respective implementations having 4, 2, or 1 channels on each DIMM, respectively. In (16+4 or 8+2) implementations, overall memory DRAM overhead is twenty-five percent (25%) as one ECC DRAM per four data DRAMs is allocated (¼=0.25).

The RAIM memory design may also be implemented in 4-channel, 2 DIMMs coupled via 2 channels per DIMM, or 4 DIMMs coupled via one channel per DIMM. In an implementation using ×8 DRAM chips, each channel is coupled to a set of 8 data DRAMs and 3 ECC DRAMs; that is, (8+3). In the same embodiment, an overall memory DRAM overhead is thirty seven and a half percent (37.5%) as three (3) ECC DRAM per eight (8) data DRAM are used for supporting RAIM functionalities (⅜=0.375). In another implementation using ×4 DRAM chips, each channel is coupled to a set of 16 data DRAMs and 6 ECC DRAMs; that is, (16+6). An overall memory DRAM overhead of the same embodiment is also 37.5% as in ×8 implementations, because the data to ECC ratio is the same 8:3 in both implementations.

In comparison, a conventional 5-channel, 5-DIMM design employed in some mainframes has an overall memory DRAM overhead of over 40%, resulting from using 13 additional DRAMs for every 32 DRAMs, or over 56% using 18 additional DRAMs, including spare DRAMs, in implementations.

Table 2 below presents an existing RAIM memory design using 5-channel, 5-DIMMs in order to support RAIM functionalities. In the first and second columns of Table 2 below, embodiments of currently available 5-channel, 5-DIMM RAIM design are presented. As noted in Table 1 above, the first row "A" is the number of RAIM channels, and the second row "B" is a number of data symbols (d) and a number of ECC symbols (e) per channel, that is B=d+e.

The third row "C" of Table 2 indicates a total number of symbols (C), aggregating the number of symbols per channel (B) for all five (5) channels. As a fifth DIMM of 5-channel, 5-DIMM embodiments are used only for ECC, but no data symbol, the number of ECC symbols (r) is 13 for a ×8 DIMM implementation, which includes one symbol from first four DIMMs, and all nine symbols from the fifth DIMM, that is, 13=1*4+9. Similarly, for a ×8 DIMM implementation, the number of ECC symbols (r) is 36, which includes four symbols from the first four DIMMs, and all twenty symbols from the fifth DIMM, that is 36=4*4+20.

In order to support RAIM functionality, a total number of ECC symbols (r) is to be greater than the number of symbols for channel marking (s), that is (r=e')>s, as noted in Table 1. The third column under "×4 4DIMM" of Table 2 presents an example demonstrating that the 5-channel, 5-DIMM design may not support RAIM functionalities without the fifth DIMM carrying all ECC symbols. In "×4 4DIMM" column of Table 2 representing a 4-channel, 4-DIMM design, the number of ECC symbols (r=16 in fourth row) is less than the number of symbols necessary for channel marks (s=20 in sixth row), that is, r<s. Accordingly, the 4-channel, 4-DIMM design may not support RAIM functionality.

The fourth row "r" of Table 2 is the total number of ECC symbols (r), which is the second term (e') of C from the third row, respective to implementations of the columns. Similar to Table 1, the value of r=e' represents the total number of symbols that may be used for RAIM functionalities. Each of the following rows, five through eight, represents different uses for the r=e' number of symbols. While only two combinations of ×4 and ×8 implementations are presented, other RAIM-capable combinations of p, s, t, and x may be selected in other implementations.

The fifth row beginning with "p" through eighth row beginning with "x" of Table 2 are derived in a similar way to the corresponding rows of Table 1. In the fifth row, the value of p=3 to indicate 100% DRAM detection and correction.

In the sixth row of Table 2, s=(d+e) represents the number of symbols needed to mark a single channel in three embodiments of Table 2. As noted, in "×4 4DIMM" column representing a 4-channel, 4-DIMM, one DIMM per channel design, the number of ECC symbols (r=16) is less than the number of symbols necessary for single channel marks (s=20), indicating that the 4-channel, 4-DIMM design does not have enough symbol to mark a single channel (r≥20), and consequently, the 4-channel, 4-DIMM design is not feasible as a RAIM memory design.

In another embodiment having 4-channels with 4×4 DIMMs, not presented in Table 2, each DIMM having 16 data DRAMs and 6 ECC DRAMs, there are 22 DRAMs per channel. Then, with r=6*4=24, there are enough symbols to support channel marking (22 symbols), including two additional symbols for single symbol correction (but lack of two-symbol detection), that is, p=2. In an embodiment where p=2, double-symbol detection will result in an uncorrectable error (UE) for all two-symbol errors, while limiting the amount of correction within a single-symbol error (e.g. single bit correction, double-symbol detection).

TABLE 2

| Spec | ×8 5DIMM | ×4 5DIMM | ×4 4DIMM |
|---|---|---|---|
| A | 5 | 5 | 4 |
| B = (d + e) | 8 + 1 | 16 + 4 | 16 + 4 |
| C = (d' + e') | 32 + 13 | 64 + 36 | 64 + 16 |
| r = e' | 13 | 36 | 16 |
| p | 3 | 3 | 3 |
| s = (d + e) | 9 | 20 | 20 |
| t | 6 (×8) | 14 | — |
| x | 2 | 2 | — |

FIG. 5 depicts an example of a RAIM memory system 200 of FIG. 1, in accordance with one or more embodiments set forth herein, where a single (i.e., common) buffer for a unit (e.g., a DIMM) is shared for command, address, and data.

A common buffer DIMM 510 includes a common buffer 530 and two (2) ranks of DRAMs 520, 521 communicating with the host 210 via a common buffer 530. A channel 295 between the host 210 and the common buffer DIMM 510 carries command, address, and data signals, and the common buffer 530 distributes data signals to the destination DRAMs in the two ranks 520, 521 in executing the command. In an embodiment, the two ranks 520 and 521 are selected using a rank address bit.

In FIGS. 5, 6, and 7, a DIMM is dual-ranked, and each rank includes ten (10) DRAM chips, noted with "D", as in respective ×4 DIMM implementations of the embodiments 201, 202, and 203. Within the respective DIMMs 510, 511, 512, the ranks 520, 521 share internal bus interfaces across DRAMS for command/address signals, which are not shown. Among the DRAMs, shaded DRAMs indicate ECC DRAMs, and the rest of DRAMs are data DRAMs. Internal address bus interfaces interconnecting the DRAMs in two ranks 520, 521 are not shown. The host 210 is similar to the host 210 of FIG. 1, including the RAIM 230, and all signals are communicated via the RAIM 230. In this specification, the term "bus", or "bus interface", refers to various types of data paths carrying command/address/data signals; and the term "channel" refers to an interface of all signals between the DIMMs and the host 210.

By using the Fifth generation of Double Data Rate Synchronous Dynamic Random Access Memory (DDR5 SDRAM, hereinafter DDR5) for the DIMMs in FIGS. 5, 6, and 7, the embodiments of the RAIM memory system 200 may fully utilize high speed, high performance, and improved power efficiency including double the bandwidth and density over DDR4 and improved channel efficiency.

FIG. 6 depicts an example of a distributed buffer solution for the RAIM memory system 200 of FIG. 1, in accordance with one or more embodiments set forth herein.

A distributed buffer DIMM 511 includes an address buffer 531, a plurality of data buffers (DBs) 533, and two (2) ranks of DRAMs 520, 521 communicating with the host 210 via the address buffer 531 and the data buffers 533. A data buffer (DB) of the data buffers (DBs) 533 is allocated per each set of DRAMs coupled across in the two ranks 520, 521, as represented by the arrows between respective data buffers (DBs) and DRAMs (Ds) in the distributed buffer DIMM 511. The channel 296 includes a command/address bus between the host 210 and the address buffer 531 and respective data buses between the host 210 and each data buffer (DB). Data coming from the host 210 are distributed across the plurality of the data buffers (DBs) 533. In an embodiment, the channel 296 consists of unidirectional buses in each direction (host-to-memory: host 210 to address buffer 531 and host 210 to data buffers 533 and memory-to-host: address buffer 531 to host 210 and data buffers 533 to host 210).

FIG. 7 depicts an example of a direct connection solution for the RAIM memory system 200 of FIG. 1, in accordance with one or more embodiments set forth herein.

A direct connection DIMM 512 includes two (2) ranks of DRAMs 520, 521 directly communicating with the host 210. The channel 297 includes a command/address bus between the host 210 and a first rank 521, and respective data buses between the host 210 and each DRAM (D). Data coming from the host 210 are distributed across the DRAMs in one of the two ranks, either 520 or 521, via the data buses. In an embodiment, the channel 297 consists of unidirectional buses in each direction (host-to-memory: host 210 to DRAM (D) and memory-to-host: DRAM (D) to host 210).

A memory system includes: a plurality of memory modules, where each memory module of the plurality of memory modules has a predefined number of sets of memory devices including one or more data memory devices for data and one or more error correction code (ECC) memory devices for ECC, where the ECC memory devices carry a predetermined number of ECC symbols in order to facilitate redundant array of independent memory (RAIM) functionalities for the plurality of memory modules; a host including a memory controller executing RAIM operations, based on the ECC symbols from the memory modules; and a predefined number of channels coupling the host and the plurality of memory modules, where each channel of the predefined number of channels corresponds to a set of the predefined number of sets, where the predefined number of sets communicate with the host via respectively corresponding channels of the predefined number of channels.

The aforementioned memory system, where the host uses the Reed-Solomon Error Correction Code in order to provide the RAIM functionalities, and where at least one of the RAIM functionalities is selected from the group consisting of: memory error detection, memory error correction, chip marking, channel marking, chipkill, per-rank channel marking, graduated chip marking, hierarchical channel marking, static and dynamic lane sparing, channel cyclic redundancy check (CRC) checking, channel recovery, dynamic channel marking, power save marking, fourth generation double data rate memory (DDR4) support, fifth generation double data rate memory (DDR5) support, system scrub, initialization, self-test, and OpenCAPI (Coherent Accelerator Processor Interface) memory channel interface.

The aforementioned memory system, where a number of the data memory devices (d) and a number of the ECC memory devices (e) in a set of the sets in the memory system are respectively determined by the RAIM functionalities to support, where the predetermined number of the ECC symbols (r) is determined from the sum of ECC memory devices (e) in all the predefined number of the channels (A), that is, r=Σe (for all A), and where the predefined number of the ECC symbols (r) is greater than a sum of the number of the data memory devices (d) and the number of the ECC memory devices (e), that is, r>(d+e), in order to support the RAIM functionalities.

The aforementioned memory system, where the memory devices have a predefined bitwise data width, where a number of the memory modules is equal to the predefined number of channels, and where each of the memory modules corresponds to a set from the predefined number of sets.

The same memory system as the aforementioned memory system, where the predefined bitwise data width is equal to four (4), where the predefined number of channels is equal to eight (8), where the number of the data memory devices is equal to eight (8) and the number of the ECC memory devices is equal to two (2), respectively in each set corresponding to each memory module.

The same memory system as the aforementioned memory system, where the predefined bitwise data width is equal to four (4), where the predefined number of channels is equal to four (4), where the number of the data memory devices is equal to sixteen (16) and the number of the ECC memory devices is equal to three (3), respectively in each set corresponding to each memory module.

The same memory system as the aforementioned memory system, where the predefined bitwise data width is equal to eight (8), where the predefined number of channels is equal to eight (8), and where the number of the data memory devices is equal to four (4) and the number of the ECC memory devices is equal to one (1), respectively in each set corresponding to each memory module.

The same memory system as the aforementioned memory system, where the predefined bitwise data width is equal to eight (8), where the predefined number of channels is equal to four (4), and where the number of the data memory devices is equal to eight (8) and the number of the ECC memory devices is equal to three (3), respectively in each set corresponding to each memory module.

The aforementioned memory system, where the memory devices have a predefined bitwise data width, where a number of the memory modules is equal to a half of the predefined number of channels, and where each of the memory modules corresponds to two (2) sets from the predefined number of sets.

The aforementioned memory system, where the memory devices have a predefined bitwise data width, where a number of the memory modules is equal to a quarter of the predefined number of channels, and where each of the memory modules corresponds to four (4) sets from the predefined number of sets.

The aforementioned memory system, where each set of the predefined number of sets of the memory devices further includes a buffer shared for command, address, and data signals.

The aforementioned memory system, where each set of the predefined number of sets of the memory devices further includes an address buffer for command and address signals, and data buffers for each cross-rank set of the memory devices sharing the internal bus.

The aforementioned memory system, where each set of the predefined number of sets of the memory devices does not include any buffer and each channel from the host connects directly to respective cross-rank set of the memory devices sharing the internal bus.

The aforementioned memory system, where the host supports channel marking, further including zero or more from the group consisting of: cyclic redundancy check (CRC); channel recovery and dynamic channel marking; hierarchical channel marking; and power save marking.

The aforementioned memory system, where the host supports Dynamic Random Access Memory (DRAM) chip marking, where the memory devices are respectively corresponding to a DRAM chip.

The aforementioned memory system, where the RAIM functionalities supported by the ECC symbols further include static lane sparing and dynamic lane sparing.

The aforementioned memory system, where each of the memory modules corresponds to a Dual Inline Memory Module (DIMM), where each of the memory devices corresponds to a Fifth-generation Double Data Rate Dynamic Random Access Memory (DDR5 DRAM) chip.

The aforementioned memory system, where each set of the sets of memory devices is located in a rank of one or more rank within a memory module of the memory modules.

Another memory system including: a plurality of memory modules, where each memory module of the plurality of memory modules has a predefined number of sets of memory devices including one or more data memory devices for data, one or more error correction code (ECC) memory devices for ECC, and one or more buffer, where the ECC memory devices carry a number of ECC symbols in order to facilitate redundant array of independent memory (RAIM) functionalities for the plurality of memory modules; a host including a memory controller executing RAIM operations, based on the ECC symbols from the memory modules; and a predefined number of channels coupling the host and the plurality of memory modules for memory operations, where the predefined number of channels is equal to the predefined number of the sets of the memory devices, and where each of the memory module has the same number of set of the memory devices as the rest of the memory modules.

A method for controlling a memory system including: obtaining, by a host, a predetermined number of Error Correction Code (ECC) symbols from each memory operation in a predefined number of homogeneous memory modules; decoding the ECC symbols for supported Redundant Array of Independent Memory (RAIM) functionalities; and executing RAIM operation as specified in an ECC scheme of the memory system, where at least one of the RAIM functionalities is selected from the group consisting of: memory error detection, memory error correction, chip marking, channel marking, chipkill, per-rank channel marking, graduated chip marking, hierarchical channel marking, static and dynamic lane sparing, channel cyclic redundancy check (CRC) checking, channel recovery, dynamic channel marking, power save marking, fourth generation double data rate memory (DDR4) support, fifth generation double data rate memory (DDR5) support, system scrub, initialization, self-test, and OpenCAPI (Coherent Accelerator Processor Interface) memory channel interface.

FIG. 8 depicts one example of a computing environment that may incorporate one or more aspects of an embodiment of the present invention.

One embodiment of a computing environment to incorporate and use one or more aspects of the present invention is described with reference to FIG. 8. In one example, the computing environment is based on the z/Architecture, offered by International Business Machines Corporation, Armonk, N.Y. One embodiment of the z/Architecture is described in "z/Architecture Principles of Operation," IBM Publication No. SA22-7832-10, March 2015, which is hereby incorporated herein by reference in its entirety. Z/ARCHITECTURE is a registered trademark of International Business Machines Corporation, Armonk, N.Y., USA.

In another example, the computing environment is based on the Power Architecture, offered by International Business Machines Corporation, Armonk, N.Y. One embodiment of the Power Architecture is described in "Power ISA™ Version 2.07B," International Business Machines Corporation, Apr. 9, 2015, which is hereby incorporated herein by reference in its entirety. POWER ARCHITECTURE is a registered trademark of International Business Machines Corporation, Armonk, N.Y., USA.

The computing environment may also be based on other architectures, including, but not limited to, the Intel x86 architectures. Other examples also exist.

As shown in FIG. 8, a computing environment 100 includes, for instance, a computer system 102 shown, e.g., in the form of a general-purpose computing device. Computer system 102 may include, but is not limited to, one or more processors or processing units 104 (e.g., central processing units (CPUs)), a memory 106 (a.k.a., system memory, main memory, main storage, central storage or storage, as examples), and one or more input/output (I/O) interfaces 108, coupled to one another via one or more buses and/or other connections 110.

Bus 110 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 106 may include, for instance, a cache 120, such as a shared cache, which may be coupled to local caches 122 of processors 104. Further, memory 106 may include one or more programs or applications 130, an operating system 132, and one or more computer readable program instructions 134. Computer readable program instructions 134 may be configured to carry out functions of embodiments of aspects of the invention.

Computer system 102 may also communicate via, e.g., I/O interfaces 108 with one or more external devices 140, one or more network interfaces 142, and/or one or more data storage devices 144. Example external devices include a user terminal, a tape drive, a pointing device, a display, etc. Network interface 142 enables computer system 102 to communicate with one or more networks, such as a local area network (LAN), a general wide area network (WAN), and/or a public network (e.g., the Internet), providing communication with other computing devices or systems.

Data storage device 144 may store one or more programs 146, one or more computer readable program instructions 148, and/or data, etc. The computer readable program instructions may be configured to carry out functions of embodiments of aspects of the invention.

Computer system 102 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 102. Examples, include, but are not limited to: microcode, device drivers, redundant processing units, external disk drive arrays, redundant array of independent disks (RAID) systems, tape drives, and data archival storage systems, etc.

Computer system 102 may be operational with numerous other general purpose or special purpose computing system environments or configurations. Examples of well-known computing systems, environments, and/or configurations that may be suitable for use with computer system 102 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, radio frequency (RF), etc., or any suitable combination of the foregoing.

Computer program code for carrying out operations for aspects may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The block diagrams in the Figures illustrate the architecture, functionality, and operation of possible implementations of systems, methods and computer program products according to various embodiments of the present disclosure. In this regard, each block in the block diagrams may represent a module, segment, or portion of code, which comprises one or more executable instructions for implementing the specified logical function(s). It should also be noted that, in some alternative implementations, the functions discussed hereinabove may occur out of the disclosed order. For example, two functions taught in succession may, in fact, be executed substantially concurrently, or the functions may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

The terminology used herein is for the purpose of describing particular embodiments only and is not intended to be limiting of the one or more aspects. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In one or more aspects, the verb "may" is used to designate optionality/non-compulsoriness. In other words, something that "may" can, but need not.

The corresponding structures, materials, acts, and equivalents of all means or step plus function elements in the claims below are intended to include any structure, material, or act for performing the function in combination with other claimed elements as specifically claimed. The description of one or more aspects has been presented for purposes of illustration and description, but is not intended to be exhaustive or limited to the one or more aspects in the form disclosed. Many modifications and variations will be apparent to those of ordinary skill in the art without departing from the scope and spirit of the one or more aspects. The embodiment was chosen and described in order to best explain the principles of the one or more aspects and the practical application, and to enable others of ordinary skill in the art to understand the one or more aspects for various embodiments with various modifications as are suited to the particular use contemplated.

What is claimed is:

1. A memory system comprising:
a plurality of memory modules, wherein each memory module of the plurality of memory modules has a predefined number of sets of memory devices including one or more data memory devices for data and one or more error correction code (ECC) memory devices for ECC, wherein the ECC memory devices carry a predetermined number of ECC symbols in order to facilitate redundant array of independent memory (RAIM) functionalities for the plurality of memory modules;
a host comprising a memory controller executing RAIM operations, based on the ECC symbols from the memory modules; and
a predefined number of channels coupling the host and the plurality of memory modules, wherein each channel of the predefined number of channels corresponds to a set of the predefined number of sets, wherein the predefined number of sets communicate with the host via respectively corresponding channels of the predefined number of channels.

2. The memory system of claim 1, wherein the host uses the Reed-Solomon Error Correction Code in order to provide the RAIM functionalities, and wherein at least one of the RAIM functionalities is selected from the group consisting of: memory error detection, memory error correction, chip marking, channel marking, chipkill, per-rank channel marking, graduated chip marking, hierarchical channel marking, static and dynamic lane sparing, channel cyclic redundancy check (CRC) checking, channel recovery, dynamic channel marking, power save marking, fourth generation double data rate memory (DDR4) support, fifth generation double data rate memory (DDR5) support, system scrub, initialization, self-test, and OpenCAPI (Coherent Accelerator Processor Interface) memory channel interface.

3. The memory system of claim 1, wherein a number of the data memory devices (d) and a number of the ECC memory devices (e) in a set of the sets in the memory system are respectively determined by the RAIM functionalities to support, wherein the predetermined number of the ECC symbols (r) is determined from the sum of ECC memory devices (e) in all the predefined number of the channels (A), that is, $r=\Sigma e$ (for all A), and wherein the predefined number of the ECC symbols (r) is greater than a sum of the number of the data memory devices (d) and the number of the ECC memory devices (e), that is, $r>(d+e)$, in order to support the RAIM functionalities.

4. The memory system of claim 1, wherein the memory devices have a predefined bitwise data width, wherein a number of the memory modules is equal to the predefined number of channels, and wherein each of the memory modules corresponds to a set from the predefined number of sets.

5. The memory system of claim 4, wherein the predefined bitwise data width is equal to four (4), wherein the predefined number of channels is equal to eight (8), wherein the number of the data memory devices is equal to eight (8) and the number of the ECC memory devices is equal to two (2), respectively in each set corresponding to each memory module.

6. The memory system of claim 4, wherein the predefined bitwise data width is equal to four (4), wherein the predefined number of channels is equal to four (4), wherein the number of the data memory devices is equal to sixteen (16) and the number of the ECC memory devices is equal to three (3), respectively in each set corresponding to each memory module.

7. The memory system of claim 4, wherein the predefined bitwise data width is equal to eight (8), wherein the predefined number of channels is equal to eight (8), and wherein the number of the data memory devices is equal to four (4) and the number of the ECC memory devices is equal to one (1), respectively in each set corresponding to each memory module.

8. The memory system of claim 4, wherein the predefined bitwise data width is equal to eight (8), wherein the predefined number of channels is equal to four (4), and wherein the number of the data memory devices is equal to eight (8) and the number of the ECC memory devices is equal to three (3), respectively in each set corresponding to each memory module.

9. The memory system of claim 1, wherein the memory devices have a predefined bitwise data width, wherein a number of the memory modules is equal to a half of the predefined number of channels, and wherein each of the memory modules corresponds to two (2) sets from the predefined number of sets.

10. The memory system of claim 1, wherein the memory devices have a predefined bitwise data width, wherein a number of the memory modules is equal to a quarter of the predefined number of channels, and wherein each of the memory modules corresponds to four (4) sets from the predefined number of sets.

11. The memory system of claim 1, wherein each set of the predefined number of sets of the memory devices further includes a buffer shared for command, address, and data signals.

12. The memory system of claim 1, wherein each set of the predefined number of sets of the memory devices further includes an address buffer for command and address signals, and data buffers for each cross-rank set of the memory devices sharing the internal bus.

13. The memory system of claim 1, wherein each set of the predefined number of sets of the memory devices does not include any buffer and each channel from the host connects directly to respective cross-rank set of the memory devices sharing the internal bus.

14. The memory system of claim 1, wherein the host supports channel marking, further comprising zero or more from the group consisting of: cyclic redundancy check (CRC); channel recovery and dynamic channel marking; hierarchical channel marking; and power save marking.

15. The memory system of claim 1, wherein the host supports Dynamic Random Access Memory (DRAM) chip marking, wherein the memory devices are respectively corresponding to a DRAM chip.

16. The memory system of claim 1, wherein the RAIM functionalities supported by the ECC symbols further include static lane sparing and dynamic lane sparing.

17. The memory system of claim 1, wherein each of the memory modules corresponds to a Dual Inline Memory Module (DIMM), wherein each of the memory devices corresponds to a Fifth-generation Double Data Rate Dynamic Random Access Memory (DDR5 DRAM) chip.

18. The memory system of claim 1, wherein each set of the sets of memory devices is located in a rank of one or more rank within a memory module of the memory modules.

19. A memory system comprising:
a plurality of memory modules, wherein each memory module of the plurality of memory modules has a predefined number of sets of memory devices including one or more data memory devices for data, one or more error correction code (ECC) memory devices for ECC, and one or more buffer, wherein the ECC memory devices carry a number of ECC symbols in order to facilitate redundant array of independent memory (RAIM) functionalities for the plurality of memory modules;
a host comprising a memory controller executing RAIM operations, based on the ECC symbols from the memory modules; and
a predefined number of channels coupling the host and the plurality of memory modules for memory operations, wherein the predefined number of channels is equal to the predefined number of the sets of the memory devices, and wherein each of the memory module has the same number of set of the memory devices as the rest of the memory modules.

20. A method for controlling a memory system comprising:
obtaining, by a host, a predetermined number of Error Correction Code (ECC) symbols from each memory operation in a predefined number of homogeneous memory modules;
decoding the ECC symbols for supported Redundant Array of Independent Memory (RAIM) functionalities; and
executing RAIM operation as specified in an ECC scheme of the memory system, wherein at least one of the RAIM functionalities is selected from the group consisting of: memory error detection, memory error correction, chip marking, channel marking, chipkill, per-rank channel marking, graduated chip marking, hierarchical channel marking, static and dynamic lane sparing, channel cyclic redundancy check (CRC) checking, channel recovery, dynamic channel marking, power save marking, fourth generation double data rate memory (DDR4) support, fifth generation double data rate memory (DDR5) support, system scrub, initialization, self-test, and OpenCAPI (Coherent Accelerator Processor Interface) memory channel interface.

* * * * *